United States Patent [19]
Ward et al.

[11] Patent Number: 6,083,771
[45] Date of Patent: Jul. 4, 2000

[54] METHOD AND SYSTEM FOR MANUFACTURING THEFT-DETERRENT COMPUTER COMPONENTS

[75] Inventors: James Peter Ward, Raleigh; Richard Mark Flanagan, Apex, both of N.C.; James Andrew McNee, Renfren; Brian John Walsh, Clydebank, both of United Kingdom

[73] Assignee: International Business Machines Corporation, Armonk, N.Y.

[21] Appl. No.: 09/024,474

[22] Filed: Feb. 17, 1998

[51] Int. Cl.[7] ........................................ B44C 1/22
[52] U.S. Cl. ..................... 438/106; 438/15; 216/62; 216/74
[58] Field of Search .................. 216/65, 74, 62; 438/15, 17, 106, 463, 706, 705; 711/103; 235/462, 490–492

[56] References Cited

U.S. PATENT DOCUMENTS

| | | | |
|---|---|---|---|
| 5,276,860 | 1/1994 | Fortier et al. | 395/575 |
| 5,354,979 | 10/1994 | Adelson et al. | 235/491 |
| 5,447,335 | 9/1995 | Haslop | 283/91 |
| 5,626,966 | 5/1997 | Kulper et al. | 428/423.1 |
| 5,801,067 | 9/1998 | Shaw et al. | 438/15 |
| 5,815,292 | 9/1998 | Walters | 359/2 |

*Primary Examiner*—Thi Dang
*Assistant Examiner*—Alva C Powell
*Attorney, Agent, or Firm*—George E. Grosser; Felsman, Bradley, Vaden, Gunter & Dillon, LLP

[57] ABSTRACT

A method and system for manufacturing theft-deterrent computer components is disclosed. Initially, computer components are grouped in a single batch. Each of the computer components are then provided with multiple indelible indicia during manufacturing. All of the indelible indicia on each component have a common value that is different than that assigned to any other computer component.

9 Claims, 4 Drawing Sheets

METHOD AND SYSTEM FOR MANUFACTURING THEFT-DETERRENT COMPUTER COMPONENTS

BACKGROUND OF THE INVENTION

1. Technical Field

The present invention relates to a method and system for product manufacturing in general, and in particular to a method and system for manufacturing computer components. Still more particularly, the present invention relates to a method and system for manufacturing theft-deterrent computer components.

2. Description of the Prior Art

A computer system is typically comprised of many components, with some of which are more expensive than others. The more expensive computer components include, inter alia, microprocessors and random access memory (RAM) modules such as dual in-line memory modules (DIMMs) and single in-line memory modules (SIMMs). In recent years, larceny of these more expensive computer components has been increasing at an alarming rate. This is partly attributable to the fact that there is a growing demand for expensive computer components in the black market. In addition, unlike most high-value manufactured items, most expensive computer components seldom have any type of distinctive markings for tracking purposes, which made them an easy target for certain illegal activities. For example, it is not improbable that a wholesaler or a retailer may re-purchase computer components that were previously taken from them illegally.

In order to combat these types of illegal activities, a few major computer manufacturers, such as International Business Machines Corporation, have begun to take numerous actions for facilitating the tracking of certain more expensive computer components. The present disclosure provides a method for manufacturing high-value computer components with theft-deterrent features.

SUMMARY OF THE INVENTION

In view of the foregoing, it is therefore an object of the present invention to provide an improved method and system for product manufacturing.

It is another object of the present invention to provide an improved method and system for manufacturing computer components.

It is yet another object of the present invention to provide an improved method and system for manufacturing theft-deterrent computer components.

In accordance with the method and system of the present invention, computer components are grouped in a single batch. Each of the computer components are then provided with multiple indelible indicia during manufacturing. All of the indelible indicia on each component have a common value that is different than that assigned to any other computer component.

All objects, features, and advantages of the present invention will become apparent in the following detailed written description.

DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

In order to provide a reliable system for tracking high-value computer components, some form of unique marking must be applied to the computer components during manufacturing. Such unique markings can also serve as a mechanism for theft-deterrence, in conjunction with their primary purpose for component tracking. As a preferred embodiment of the present invention, indelible serial information, such as a serial number, is furnished at three separate and distinct areas of a computer component, as follows:

1) written onto a blank laser etchable label;

2) etched onto a surface of the computer component; and 3) electronically written into a non-volatile memory element of the computer component.

It is important for a serial number that is written to the three distinct areas to be unique and consistent for each computer component manufactured and yet different from all other computer components produced by the same manufacturer. A date code, for example, may be utilized as part of a serial number. The present disclosure describes a method and system to enable all three separate markings to be provided in a single manufacturing process run.

Figure 1:
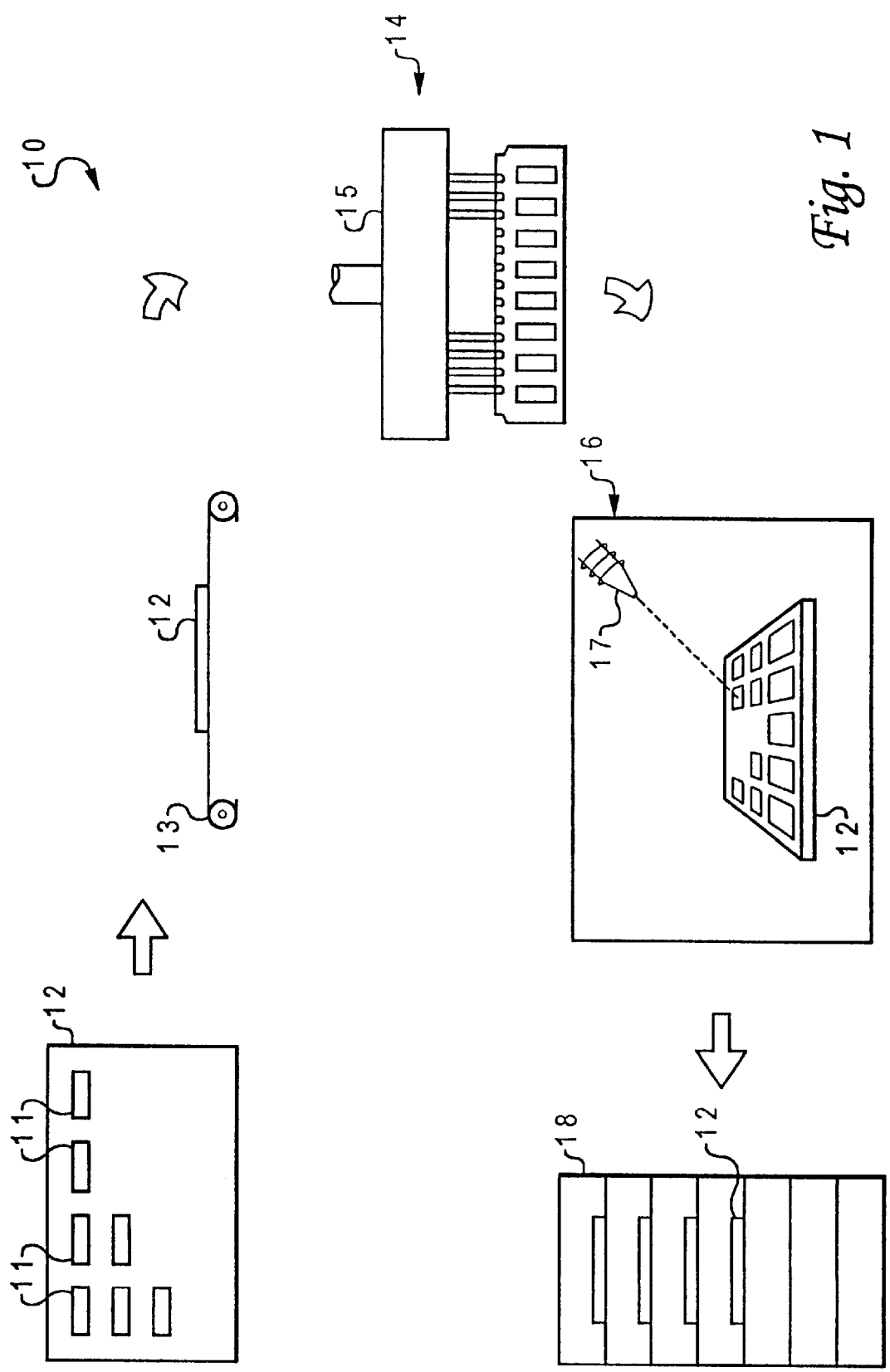
FIG. 1 is a pictorial illustration of a computer component transport system in which a preferred embodiment of the present invention is incorporated.

Referring now to the drawings and in particular to FIG. 1, there is depicted a pictorial illustration of a computer component transport system in which a preferred embodiment of the present invention is incorporated. As shown, a transport system 10 designed for transporting memory modules is utilized to illustrate a preferred embodiment of the present invention; though it is understood by those skilled in the art that the principle of the present invention is also applicable to other types of transport system adapted to transport different types of computer components.

Transport system 10 carries memory modules, such as dual in-line memory modules (DIMMs) or single in-line memory modules (SIMMs), from one station to another, as follows. Initially, a batch of memory modules 11 are loaded into a carrier tray 12. Carrier tray 12 is then placed in a stacker unit (not shown), pending a start signal. Upon a receipt of the start signal, the stacker unit places carrier tray 12 onto a conveyor belt 13. Conveyor belt 13 moves carrier tray 12 to a probe station 14. At probe station 14, probe fingers from a probe interface 15 begin to make contact with each memory module on carrier tray 12 at appropriate connector locations. At this point, serial number information is electronically written to a non-volatile memory element of each memory module on carrier tray 12 through probe interface 15. After all the memory modules on carrier tray 12 have been electronically written with a respective unique serial number, carrier tray 12 is released from probe station 14. Conveyor belt 13 then takes carrier tray 12 to a laser etching enclosure 16.

Within laser etching enclosure 16, a laser 17 is activated as soon as carrier tray 12 is locked-in to a designated position. Laser 17 then begins to etch a serial number on a carrier board of each memory module on carrier tray 12 while simultaneously writing a barcode with the same serial number information on a blank laser etchable label. Typically, the carrier board for each memory module on carrier tray 12 is a printed circuit board (PC board). Each laser etchable label, which contains glue on a surface opposite to the laser etchable surface, is attached to a corresponding memory module on carrier tray 12.

After all the memory modules on carrier tray 12 have been laser etched, and a corresponding laser etched label has been attached, carrier tray 12 is released from laser etch enclosure 16. Carrier tray 12 is subsequently moved to a upstacker 18 at which carrier tray 12 is held until its removal by an operator.

Figure 2:
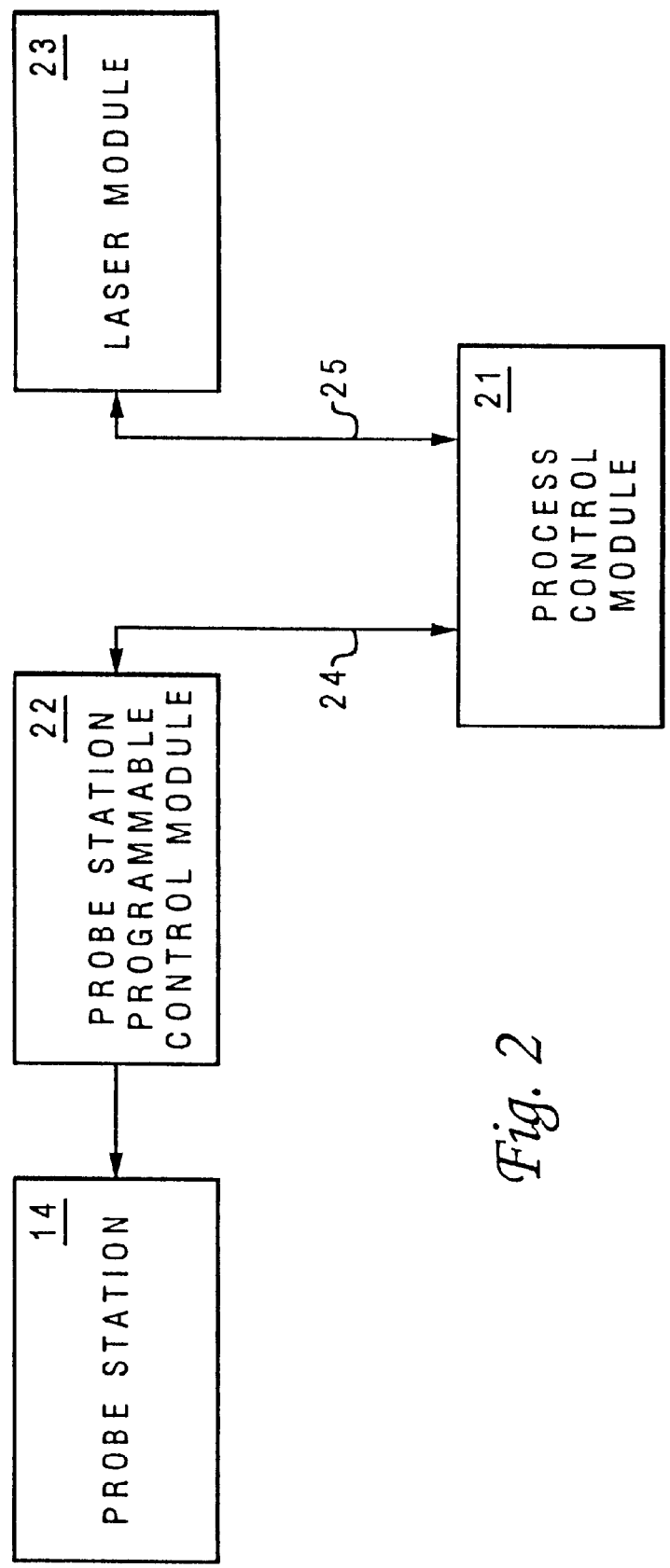
FIG. 2 is a block diagram illustrating the functional components for providing indelible markings on memory modules by the transport system from FIG. 1, in accordance with a preferred embodiment of the present invention.

With reference now to FIG. 2, there is depicted a block diagram illustrating the functional components for providing indelible markings on memory modules by the transport system from FIG. 1, in accordance with a preferred embodiment of the present invention. Probe station 14 is an electrically controlled pneumatic station that has a set of built-in probes for raising and lowering each memory module from a carrier tray. These built-in probes are under the control of a probe station programmable control module 22. Probe station programmable control module 22 includes a programmable controller unit for controlling the sequencing, serial number generation, physical operation of probe station 14, and power application to probe station 14. In addition, probe station programmable control module 22 also relates information such as a controlled set of serial numbers that have been electronically written to a non-volatile memory element, e.g., an electrical erasable-programmable read-only memory (EEPROM) within each memory module, to process control module 21. Laser module 23, which includes a laser unit and a laser control, regulates all the factors for laser etching within a laser etching enclosure. Some of the factors includes the placement of the etch data, the power of the laser unit, etc. Process control module 21 exchanges information with probe station programmable control module 22 via a communication link 24, and passes the pertinent information to laser module 23 via a communication link 25. Both communication link 24 and communication link 25 are preferably RS-232 serial communication links.

The process operation involves an operator selecting a correct component type from a user panel on process control module 21. Process control module 21 then issues a set of commands to laser module 23 via communication link 25. Laser module 23 responds by setting the laser to a ready-to-mark state, and awaits for a "start" signal from a handler system within the laser etching enclosure. With probe station 14 enabled, process control module 21 allows laser module 23 to collect the next useable serial number. At this stage, probe station 14 activates probe station programmable control module 22, and all memory modules on a carrier tray are powered up to a predefined voltage. The supplier and part number previously programmed by, for example, the memory module manufacturer, according to the Joint Electronic Design Engineering Council (JEDEC) serial product data (SPD) standard, is then read from the EEPROM within each memory module. Typically, there are 256 bytes of storage capacity in this kind of EEPROM, and the first 128 bytes contains manufacturer information. Probe station programmable control module 22 then reads back this JEDEC SPD and verifies that the memory module being probed matches with a description file specified by the operator. If there is a mis-match, probe station programmable control module 22 aborts the operation and the memory module is rejected from the process.

If the JEDEC SPD and description file correlate with each other, process control module 21 then requests the next legitimate serial number from laser module 23 via communication link 25. Process control module 21 then passes this serial number to probe station programmable control module 22 via communication link 24. Using the received serial number, probe station programmable control module 22 then generates a series of consecutive serial numbers for the batch of memory modules on the carrier tray. The generated serial numbers are passed from probe station programmable control module 22 to probe station 14 itself where the data is written to each memory module on the carrier tray. The data is then read and checked by probe station programmable control module 22. After verifying the data are correct, probe station programmable control module 22 removes power from all the memory modules and releases the probes from the memory modules. The carrier tray is then automatically moved to the laser etching enclosure for laser etching.

Within the laser etching enclosure, the laser etchable label and carrier board surface are physically etched with the same serial number previously written electronically into the EEPROM of the memory module on the carrier tray. Once again, these serial numbers are managed by process control module 21 to ensure that the appropriate serial number is written onto a laser etchable label and the carrier board surface of each memory module.

Figure 3:
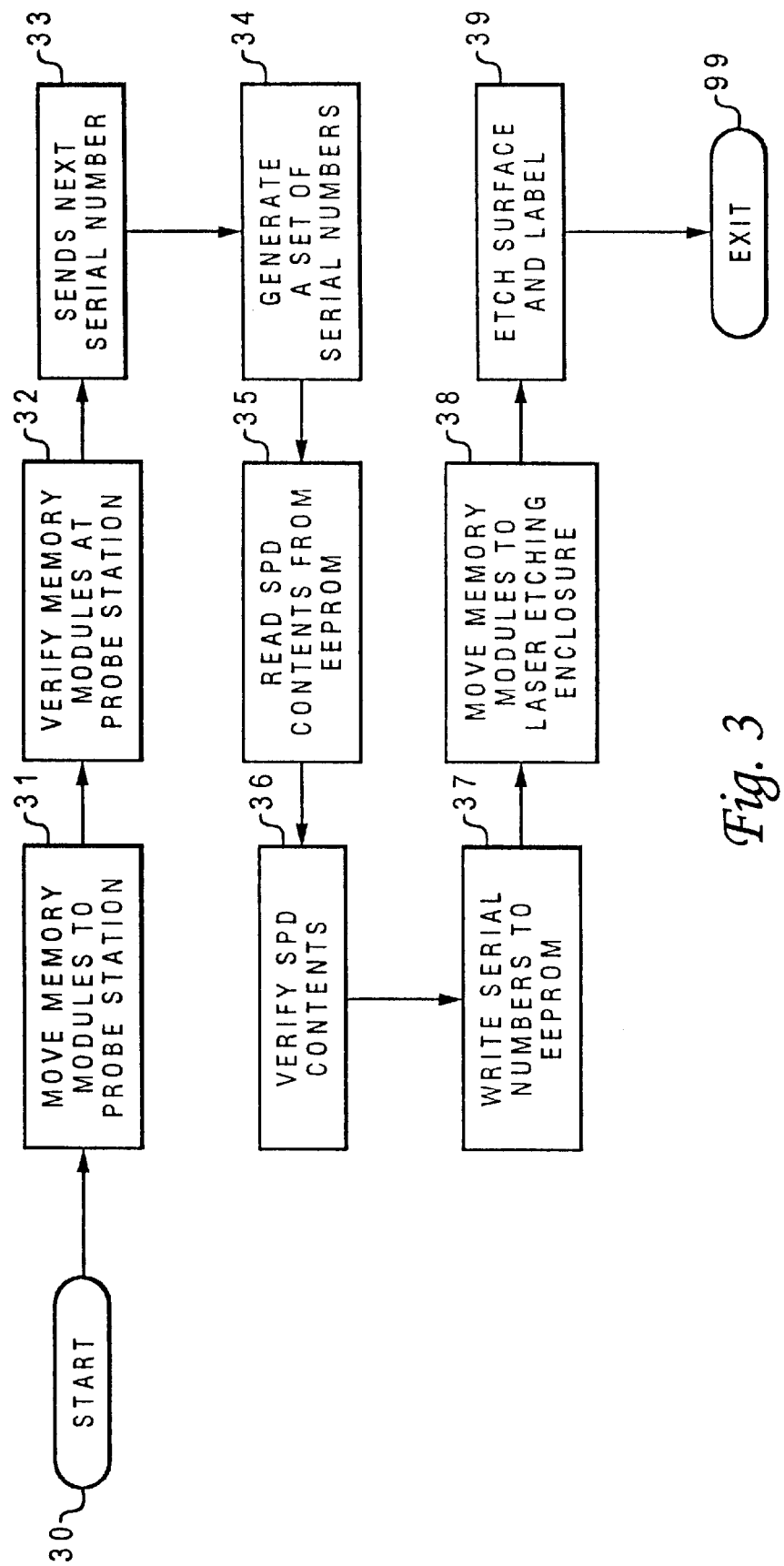
FIG. 3 is a high-level logic flow diagram of a method for manufacturing theft-deterrent computer components, in accordance with a preferred embodiment of the present invention.

Referring now to FIG. 3, there is illustrated a high-level logic flow diagram of a method for manufacturing theft-deterrent computer components, in accordance with a preferred embodiment of the present invention. Starting at block 30, memory modules are moved into a probe station under the control of a probe station programmable control module, as depicted in block 31. After verifying that memory modules are located within the probe station, as illustrated in block 32, a laser module sends the next serial number to the probe station programmable control module, as shown in block 33. The probe station programmable control module unit then generates a set of serial numbers, each unique serial number to be written to a memory module, as depicted in block 34. The probe station applies power to the memory modules and reads the JEDEC SPD from a corresponding EEPROM, as illustrated in block 35. The probe station programmable control module verifies the JEDEC SPD are correctly read for both function and content for each memory module, as shown in block 36. If the verification is correct, a serial number is then written to, most likely, the same EEPROM under the control of probe station programmable control module, as depicted in block 37. The probe station programmable control module subsequently verifies the correct information has been written, and all memory modules with a successfully written serial number are moved to a laser etching enclosure, as depicted in block 38. Within the laser etching enclosure, a laser marks a surface of each memory module as well as on a laser etchable label with the same serial number as previously stored in the corresponding EEPROM, as illustrated in block 39. The process exits at block 99.

Figure 4:
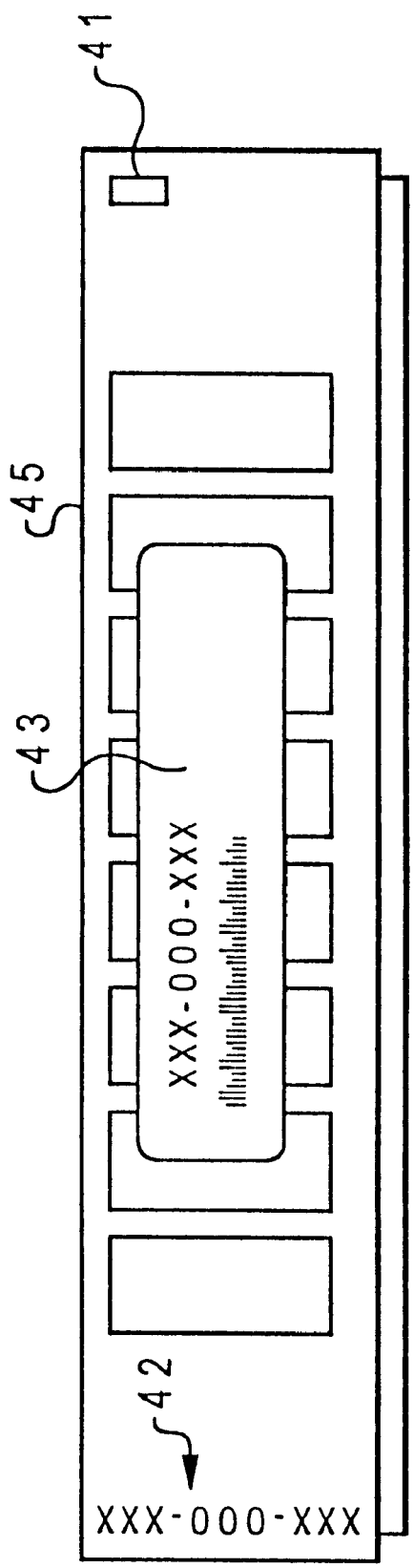
FIG. 4 is a pictorial illustration of a memory module manufactured in accordance with a preferred embodiment of the present invention.

With reference now to FIG. 4, there is illustrated a pictorial illustration of a memory module manufactured in accordance with a preferred embodiment of the present invention. As shown, memory module 45 includes a serial number electronically stored within an EEPROM 41 on memory module 45. The serial number stored in EEPROM 41 is also laser-etched on a carrier board 42 of memory module 45 and laser-etched in barcode form, on a removable label 43 attached on memory module 45. In addition to the barcode, the same serial number is also laser-etched on removable label 43.

As has been described, the present invention provides a method and system for manufacturing theft-deterrent computer components. Most likely, these computer components are high-value computer components or computer subsystems. Each of these computer components is provided with a serial number and a barcode. The serial number is laser-etched onto a surface of the computer component, and the barcode is laser-etched on a removable laser etchable label. In addition, the serial number can also be laser-etched on the removable label. As a result, both the removable label and the surface of the computer component will be marked with the same serial number information. If, for whatever reason, the removable label is dislodged after it was physically attached to the computer component itself, the computer component can still be identified by the unique serial number that was etched onto the surface of the computer component. As a preferred embodiment, the process of serial information etching on the removable label and the component surface must be done in one pass to ensure consistency between these two numbers. A further refinement to this process includes writing the serial number of the component into a third medium. As an example, the serial number can also be electronically written into an EEPROM located on the memory module. Again, it is essential that all three media (i.e., component surface, removable label, and EEPROM) carry the same serial number information.

Currently, there is no machine or process capable of performing all three of these processes concurrently to ensure consistency of serial numbers across all three media as described above. The present disclosure describes a method and system that have been developed to implement such a process. Specifically, the present invention provides a method and system for marking a memory module in three separate media in a controlled and consistent manner. The present invention provides a capability for a computer component identification to be in both human readable and software readable format. Although memory modules are utilized for the purpose of illustration, the concept of the present invention can easily be applied to other types of computer components and entities.

While the invention has been particularly shown and described with reference to a preferred embodiment, it will be understood by those skilled in the art that various changes in form and detail may be made therein without departing from the spirit and scope of the invention.

What is claimed is:

1. A method for manufacturing theft-deterrent computer components, said method comprising the steps of:

allocating computer components in a single batch; and providing a plurality of indelible indicia on each computer component for theft-deterrent purposes during the manufacturing of said batch of computer components, wherein said plurality of indelible indicia includes programming serial information within a non-volatile memory element, a surface marking containing information substantially equivalent to said serial information, and a laser-etched marking containing information substantially equivalent to said serial information, wherein all of said plurality of indelible indicia on each component have a common value but said value is different from that provided on any other computer components.

2. The method for manufacturing according to claim 1, wherein said providing step further includes a step of providing a barcode on a label to be attached to said computer component, wherein said barcode contains information substantially equivalent to said serial information.

3. The method for manufacturing according to claim 2, wherein said providing step further includes a step of providing a laser-etched barcode on a label to be attached to said computer component for theft-deterrent purposes.

4. A system for manufacturing theft-deterrent computer components, said system comprising:

means for allocating computer components in a single batch; and means for providing a plurality of indelible indicia on each computer component for theft-deterrent purposes during the manufacturing of said batch of computer components, wherein said plurality of indelible indicia includes programming serial information within a non-volatile memory element, a surface marking containing information substantially equivalent to said serial information, and a laser-etched marking containing information substantially equivalent to said serial information, wherein all of said plurality of indelible indicia on each component have a common value but said value is different from any other computer components.

5. The system for manufacturing according to claim 3, wherein said marking is a laser-etched marking.

6. The system for manufacturing according to claim 1, wherein said barcode is a laser-etched barcode.

7. A computer component comprising:

a marking on a surface of said computer component, wherein said marking includes serial information;

a barcode on a label to be attached to said computer component, wherein said barcode contains said serial information; and a non-volatile memory containing said serial information for theft-deterrent purposes.

8. The computer component according to claim 7, wherein said marking is a laser-etched marking.

9. The computer component according to claim 7, wherein said barcode is a laser-etched barcode.

* * * * *